United States Patent
Hirayama

(10) Patent No.: US 8,867,885 B2
(45) Date of Patent: Oct. 21, 2014

(54) OPTICAL WAVEGUIDE FORMING EPOXY RESIN COMPOSITION, OPTICAL WAVEGUIDE FORMING CURABLE FILM, LIGHT TRANSMISSION FLEXIBLE PRINTED BOARD, AND PRODUCTION METHOD FOR THE FLEXIBLE PRINTED BOARD

(71) Applicant: Nitto Denko Corporation, Ibaraki (JP)

(72) Inventor: Tomoyuki Hirayama, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 13/795,237

(22) Filed: Mar. 12, 2013

(65) Prior Publication Data
US 2013/0287351 A1  Oct. 31, 2013

(30) Foreign Application Priority Data
Apr. 25, 2012 (JP) .................. 2012-100146

(51) Int. Cl.
| | |
|---|---|
| G02B 6/00 | (2006.01) |
| C08L 63/00 | (2006.01) |
| G03F 7/004 | (2006.01) |
| C08G 59/68 | (2006.01) |
| G03F 7/038 | (2006.01) |
| C08G 59/24 | (2006.01) |
| G02B 6/02 | (2006.01) |

(52) U.S. Cl.
CPC ............... *G03F 7/004* (2013.01); *C08L 63/00* (2013.01); *C08G 59/68* (2013.01); *G03F 7/038* (2013.01); *C08G 59/245* (2013.01); *G02B 6/02* (2013.01)
USPC .......................................... 385/143; 385/145

(58) Field of Classification Search
CPC ........... G02B 2006/12069; G02B 2006/12073; G02B 2206/12071; G02B 2206/12076
USPC ................................................ 385/143, 145
See application file for complete search history.

(56) References Cited

U.S. PATENT DOCUMENTS

| | | | | |
|---|---|---|---|---|
| 7,934,965 | B2 * | 5/2011 | Hanai et al. ................ | 440/89 G |
| 2005/0201714 | A1 * | 9/2005 | Mune et al. ................... | 385/143 |
| 2005/0265685 | A1 * | 12/2005 | Ohashi et al. ................. | 385/147 |
| 2012/0033913 | A1 * | 2/2012 | Kondou et al. ................ | 385/14 |
| 2012/0283352 | A1 * | 11/2012 | Nohara et al. ................ | 522/166 |
| 2012/0326301 | A1 * | 12/2012 | Wakioka et al. .............. | 257/737 |

FOREIGN PATENT DOCUMENTS

| | | |
|---|---|---|
| JP | 2010-230944 A | 10/2010 |
| JP | 2011-027903 A | 2/2011 |
| WO | 2011/043288 A1 | 4/2011 |
| WO | 2011/090038 A1 | 7/2011 |

OTHER PUBLICATIONS

Extended European Search Report dated Jul. 3, 2013, issued in corresponding European Patent Application No. 13160797.0.
Communication Pursuant to Article 94(3) EPC dated Jun. 3, 2014, issued in European Patent aspplication No. 13160797.0 (3 pages).

* cited by examiner

*Primary Examiner* — Charlie Peng
(74) *Attorney, Agent, or Firm* — Westerman, Hattori, Daniels & Adrian, LLP

(57) ABSTRACT

An optical waveguide forming epoxy resin composition is free from a diluent component irrelevant to a curing reaction, and comprises:
(A) a liquid epoxy resin; and
(B) a photoacid generator;
  wherein the liquid epoxy resin (A) comprises a liquid epoxy resin represented by the following general formula (1) in a proportion of 40 to 75 wt % based on the overall amount of a resin component:

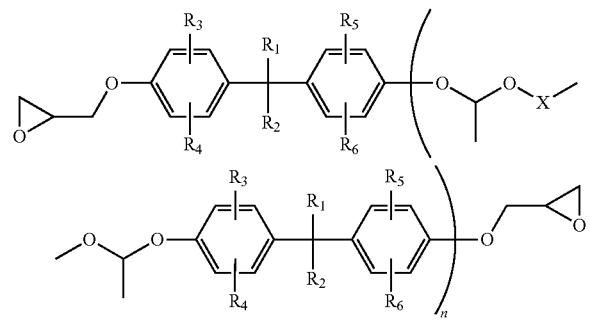

(1)

wherein $R_1$ and $R_2$ are each a hydrogen atom or a methyl group; $R_3$ to $R_6$ are each a hydrogen atom, a methyl group, a chlorine atom or a bromine atom; X is a $C_2$ to $C_{15}$ alkylene group, an ethyleneoxy group, a di(ethyleneoxy) group, a tri(ethyleneoxy) group, a propyleneoxy group, a propyleneoxypropyl group, a di(propyleneoxy)propyl group or a tri(propyleneoxy)propyl group; and n is a natural number and has an average value of 1.2 to 5.

8 Claims, No Drawings

OPTICAL WAVEGUIDE FORMING EPOXY RESIN COMPOSITION, OPTICAL WAVEGUIDE FORMING CURABLE FILM, LIGHT TRANSMISSION FLEXIBLE PRINTED BOARD, AND PRODUCTION METHOD FOR THE FLEXIBLE PRINTED BOARD

BACKGROUND OF THE INVENTION

1. Field of the Invention

The present invention relates to an optical waveguide forming epoxy resin composition and an optical waveguide forming curable film to be used as a material for a cladding layer of an optical waveguide of an optical waveguide apparatus widely used for optical communications, optical information processing and other general optics. The invention also relates to a light transmission flexible printed board and a production method for the flexible printed board.

2. Description of the Related Art

Optical waveguide cladding materials for light transmission flexible printed boards are required to have higher curing sensitivity (excellent patternability), higher flexibility and lower refractive index. In designing a material satisfying such requirements, an aliphatic resin is typically selected for the lower refractive index, and a multi-functional aliphatic epoxy resin and a long-chain bi-functional aliphatic epoxy resin, for example, are blended as required to impart the material with excellent patternability (higher sensitivity) and higher flexibility. For a cladding material particularly required to have higher flexibility, therefore, the amount of the long-chain bi-functional aliphatic epoxy resin is inevitably increased, so that a cladding layer formed by curing the cladding material tends to have a lower glass transition temperature Tg (see, for example, JP-A-2011-27903 and JP-A-2010-230944).

In a roll-to-roll process for mass production, on the other hand, a dry film technique is generally employed, in which an uncured film is used in the form of a dry film material. In order to adapt the dry film material for the roll-to-roll process, the uncured material is required to have lower tackiness and higher flexibility. In development of the material, however, these requirements reduce the material design flexibility. In production of the dry film, it is necessary to provide laminate substrates on opposite surfaces of the dry film, resulting in problems associated with resource saving and cost saving. In the material development, it is also important to adapt the material for a wet process in which a liquid material is applied onto a substrate for formation of a cladding layer and a core layer (JP-A-2010-230944).

In the wet process, a surface smoothing agent (leveling agent) is added to the material or a solvent having a higher boiling point is used to increase the surface smoothness of a coating film in a coating film forming and solvent drying step.

However, the addition of the leveling agent reduces the surface tension of the surface of the coating film, resulting in repellency of a coating liquid in the subsequent coating film forming step. This often adversely influences a waveguide loss.

Where the higher boiling point solvent is used instead of the leveling agent, on the other hand, the following problem will be encountered. Where a cladding layer material imparted with the flexibility and hence having a reduced glass transition temperature Tg is used for formation of an under-cladding layer, the higher boiling point solvent in a core layer forming material is dried at a heating temperature higher than the glass transition temperature Tg of the under-cladding layer forming material in a core layer forming and drying step in which a core layer is formed on the under-cladding layer formed from the cladding layer material. Therefore, a resin component of the core layer forming material having a higher refractive index is liable to infiltrate into the under-cladding layer having a lower refractive index. Therefore, light propagating through the core layer is liable to leak into the under-cladding layer, thereby increasing the optical waveguide loss.

Where an optical waveguide is produced in an application which requires the positional accuracy of the optical waveguide (e.g., in production of an opto-electric hybrid board), it is necessary to form three layers including an under-cladding layer, a core layer and an over-cladding layer by a photolithography process (including a coating film forming step, a solvent drying step, an alignment exposing step, a post heating step, a developing step and a drying step for each of the three layers). This increases the production costs. A technical solution to this problem is highly difficult, but omission of the solvent drying step is a relatively easy approach for reduction in the number of the process steps. Therefore, it is essential to develop a material which permits the omission of the solvent drying step.

Besides the material-based approach, an approach associated with the production process is also contemplated. In this approach, a mask coating process or a dispenser drawing process which can shape a coating film in the coating film forming step without the need for the alignment exposing step, the developing step and the drying step for the reduction in the number of the process steps is required as a coating film forming process for forming the cladding layer.

This coating film forming process, if using a coating varnish containing a solvent, essentially needs the solvent drying step (pre-baking step), making it impossible to maintain the configuration and the dimensions of the cladding layer because of reduction in resin viscosity during heating. The essential need for the solvent drying step correspondingly adds process costs. Therefore, a solvent-free coating varnish having a higher viscosity at an ordinary temperature is demanded.

However, preparation of such a coating varnish on an industrial scale encounters the following problems. If a solid resin component is present in the solvent-free system, it is difficult to mix the solid resin component with other resin component. In the preparation of the coating varnish, therefore, an excessive long heating and stirring period is required. Further, it is difficult to provide a coating varnish having an intended formulation with the solid resin component left undissolved. In addition, when the coating varnish is exposed to a lower temperature environment, the solid component is liable to be deposited to cause haze.

With such technical background, the coating varnish preferably contains only a liquid resin as a resin component in order to simplify the coating varnish preparation step and reduce cycle time (process time). There is an eager demand for a solvent-free coating varnish as a cladding layer forming material which satisfies fundamental optical waveguide property requirements (e.g., a higher glass transition temperature Tg and higher flexibility) and contains only the liquid resin as the resin component.

SUMMARY OF THE INVENTION

An optical waveguide forming epoxy resin composition and an optical waveguide forming curable film, as an optical waveguide forming material, particularly as a cladding layer forming material are provided, which ensure a higher glass transition temperature Tg and higher flexibility and reduce production costs by reduction in the number of the process steps of the production process. A light transmission flexible printed board and a production method for the flexible printed board are also provided.

According to a first aspect, there is provided an optical waveguide forming epoxy resin composition which is free from a diluent component irrelevant to a curing reaction and comprises:
(A) a liquid epoxy resin; and
(B) a photoacid generator;
wherein the liquid epoxy resin (A) comprises a liquid epoxy resin represented by the following general formula (1) as a major component thereof in a proportion of 40 to 75 wt % based on the overall amount of a resin component:

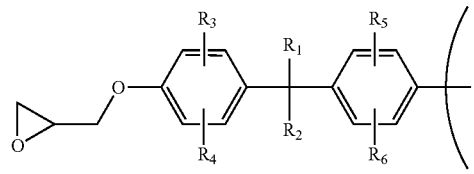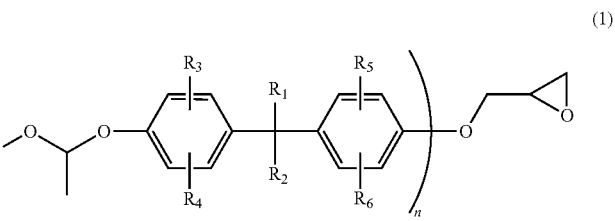

(1)

wherein $R_1$ and $R_2$ are each a hydrogen atom or a methyl group; $R_3$ to $R_6$ are each a hydrogen atom, a methyl group, a chlorine atom or a bromine atom; X is a $C_2$ to $C_{15}$ alkylene group, an ethyleneoxy group, a di(ethyleneoxy) group, a tri(ethyleneoxy) group, a propyleneoxy group, a propyleneoxypropyl group, a di(propyleneoxy)propyl group or a tri(propyleneoxy)propyl group; and n is a natural number and has an average value of 1.2 to 5.

According to a second aspect, there is provided an optical waveguide forming curable film formed from the optical waveguide forming epoxy resin composition according to the first aspect. According to a third aspect, there is provided a light transmission flexible printed board which includes an optical waveguide including a substrate, a cladding layer provided on the substrate, and a core layer provided in a predetermined pattern in the cladding layer for transmitting an optical signal, wherein the cladding layer is formed by curing the optical waveguide forming epoxy resin composition according to the first aspect or the optical waveguide forming curable film according to the second aspect.

According to a fourth aspect, there is provided a production method for the light transmission flexible printed board including the optical waveguide according to the third aspect, the method comprising an optical waveguide producing process including the steps of: forming an under-cladding layer by curing the optical waveguide forming epoxy resin composition according to the first aspect or the optical waveguide forming curable film according to the second aspect; forming a core layer in a predetermined pattern on the under-cladding layer; and forming an over-cladding layer on the under-cladding layer to cover the core layer by curing the optical waveguide forming epoxy resin composition according to the first aspect or the optical waveguide forming curable film according to the second aspect; wherein the optical waveguide producing process is free from a drying step of removing a diluent component.

An optical waveguide forming epoxy resin composition is provided which ensures a higher glass transition temperature Tg and higher flexibility for use as a material for formation of an optical waveguide cladding layer, and reduces the number of process steps and hence the production costs for production of an optical waveguide. Where the resin composition is free from the diluent component irrelevant to the curing reaction, and the liquid epoxy resin component containing the liquid epoxy resin represented by the above general formula (1) as the major component thereof is contained in the predetermined proportion as the resin component, the aforementioned object is achieved.

The contradictory characteristic properties of an aliphatic long-chain bi-functional epoxy resin and an aromatic long-chain bi-functional epoxy resin were studied, i.e., in focus on the fact that the aliphatic long-chain bi-functional epoxy resin has a reduced refractive index and is contributory to the impartment of the flexibility but significantly reduces the glass transition temperature Tg and the fact that the aromatic long-chain bi-functional epoxy resin has an increased refractive index and is less contributory to the impartment of the flexibility but moderately reduces the glass transition temperature Tg. As a result, where a semi-aliphatic skeleton is introduced into a liquid long-chain bi-functional epoxy resin contributory to the impartment of the flexibility and the resulting epoxy resin is blended in a specific proportion, it is possible to impart the resulting material with satisfactory flexibility as well as with a higher glass transition temperature Tg than the conventional aliphatic long-chain bi-functional epoxy resin while suppressing the increase in refractive index.

As described above, an optical waveguide forming epoxy resin composition is provided which comprises the aforementioned components (A) and (B) and is free from the diluent component irrelevant to the curing reaction, wherein the liquid epoxy resin (A) comprises the liquid epoxy resin represented by the above general formula (1) as the major component thereof in a proportion of 40 to 75 wt % based on the overall amount of the resin component. Therefore, a higher glass transition temperature Tg, higher flexibility and excellent patternability are ensured, for example, when an optical waveguide cladding layer is formed from the optical waveguide forming epoxy resin composition. In addition, the diluent component irrelevant to the curing reaction is not contained in the resin composition. This avoids the solvent drying step, thereby reducing the production costs.

Where the optical waveguide forming epoxy resin composition is free from a solid epoxy resin component and has a viscosity satisfying the following conditions:
(x) the viscosity is less than 100 Pas as measured at 25 C; and
(y) the viscosity is 0.5 to 8.0 Pa s as measured at 50 C with heating, the resin composition has excellent handling ease (coatability) for use as a coating varnish and improves the dispenser drawing process.

In the wet process for the formation of the core layer in the optical waveguide producing process, the use of the curable film formed from the inventive optical waveguide forming epoxy resin composition makes it possible to form the core layer without infiltration of the core resin component in the cladding layer.

The cladding layer formed by curing the optical waveguide forming epoxy resin composition has a higher glass transition temperature Tg and higher flexibility (flex resistance). Further, the light transmission flexible printed board is provided which includes the optical waveguide including the cladding layer.

DETAILED DESCRIPTION OF THE INVENTION

Next, the present invention will be described in detail by way of embodiments thereof. It should be understood that the invention be not limited to these embodiments.

<<Optical Waveguide Forming Epoxy Resin Composition>>

The optical waveguide forming epoxy resin composition includes a liquid epoxy resin (A) and a photoacid generator (B), wherein the liquid epoxy resin (A) comprises a specific component to be described later as a major component thereof in a specific proportion. Further, the optical waveguide forming epoxy resin composition is free from a diluent component irrelevant to a curing reaction. The term "liquid" or "solid" means a liquid state or a solid state observed at a temperature of 25 C.

The components (A) and (B) will hereinafter be described one by one.

<Liquid Epoxy Resin (A)>

The liquid epoxy resin (A) is a compound including a liquid epoxy resin represented by the following general formula (1) (hereinafter sometimes referred to as "specific liquid epoxy resin") as a major component thereof. The term "major component" means a principal component constituting substantially the entire compound and based on not only the use amount but also the capability of influencing the physical properties and the characteristic properties of the entire compound. That is, the major component accounts for the majority of the liquid epoxy resin (A). Specifically, the specific liquid epoxy resin may be example of a commercially available product of the liquid epoxy resin represented by the formula (1) is EXA-4816 available from DIC Corporation.

The liquid epoxy resin represented by the above formula (1) is present in a proportion of 40 to 75 wt %, preferably 50 to 70 wt %, particularly preferably 60 to 70 wt %, based on the overall amount of the resin component in the optical waveguide forming epoxy resin composition. If the proportion of the specific liquid epoxy resin is excessively small, the resulting optical waveguide has a significant linear loss. Further, it is difficult to provide a desired (highly sensitive) optical waveguide because of poorer patternability. If the proportion of the specific liquid epoxy resin is excessively great, on the other hand, the resulting optical waveguide has a greater bend loss and poorer flexibility. The resin component is herein intended to include not only the liquid epoxy resin (A) but also other resin contained in the optical waveguide forming epoxy resin composition.

For the optical waveguide forming epoxy resin composition, other liquid epoxy resin may be used, as required, in addition to the specific liquid epoxy resin.

Specific examples of the other liquid epoxy resin include a liquid bisphenol-A epoxy resin, a liquid bisphenol-F epoxy resin, a liquid hydrogenated bisphenol-A epoxy resin, a liquid 3,4-epoxycyclohexenylmethyl-3',4'-epoxycyclohexene carboxylate and a liquid 3,4-epoxycyclohexenylmethyl-3',4'-epoxycyclohexene carboxylate modified with ε-caprolactone, which may be used either alone or in combination. These compounds may be synthesized with reference to conventionally known techniques, or commercially available products may be bought for preparation of these compounds. Examples of the commercially available products include JER828 (available from Mitsubishi Chemical Corporation), EPICLON 830S (available from DIC Corporation), YX8000 (available from Mitsubishi Chemical Corporation), CEL-

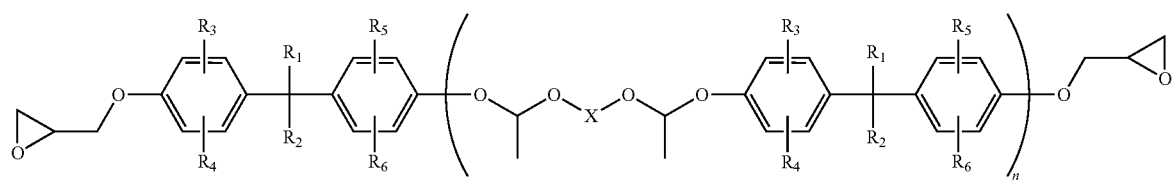

(1)

present in a proportion of 40 to 75 wt % based on the overall amount of the resin component.

wherein $R_1$ and $R_2$ are each a hydrogen atom or a methyl group; $R_3$ to $R_6$ are each a hydrogen atom, a methyl group, a chlorine atom or a bromine atom; X is a $C_2$ to $C_{15}$ alkylene group, an ethyleneoxy group, a di(ethyleneoxy) group, a tri(ethyleneoxy) group, a propyleneoxy group, a propyleneoxypropyl group, a di(propyleneoxy)propyl group or a tri(propyleneoxy)propyl group; and n is a natural number and has an average value of 1.2 to 5.

In the above formula (1), $R_1$ and $R_2$ are each a hydrogen atom or a methyl group, preferably a methyl group. $R_3$ to $R_6$ are each a hydrogen atom, a methyl group, a chlorine atom or a bromine atom, preferably a hydrogen atom. X is a $C_2$ to $C_{16}$ alkylene group, an ethyleneoxy group, a di(ethyleneoxy) group, a tri(ethyleneoxy) group, a propyleneoxy group, a propyleneoxypropyl group, a di(propyleneoxy)propyl group or a tri(propyleneoxy)propyl group. Further, n is a natural number and has an average value of 1.2 to 5. A specific LOXIDE 2021P (available from Daicel Chemical Industries, Ltd.), CELLOXIDE 2081 (available from Daicel Chemical Industries, Ltd.) and PG-207N (available from Nippon Steel Chemical Co., Ltd.) Particularly, Daicel's CELLOXIDE 2021P is preferred.

The optical waveguide forming epoxy resin composition preferably contains no solid epoxy resin. The solid epoxy resin is not used but only the liquid epoxy resin (A) is used as the epoxy resin component, whereby the optical waveguide forming epoxy resin composition can be easily prepared as a cladding layer forming material suitable for a coating varnish without the use of the diluent component irrelevant to the curing reaction of the resin component. That is, if the solid epoxy resin is contained, the viscosity of the coating varnish is significantly increased. Therefore, it is difficult to adapt the resulting resin composition for a coating process (inkjet coating or the like) which essentially requires a lower viscosity. From this viewpoint, it is supposedly advantageous to avoid the use of the solid epoxy resin in order to adapt the resin composition for various coating processes.

<Photoacid Generator (B)>

The photoacid generator (B) is blended in the optical waveguide forming epoxy resin composition in order to impart the epoxy resin composition with photo-curability, e.g., UV-curability.

Examples of the photoacid generator (B) include photopolymerization initiators such as benzoins, benzoin alkyl ethers, acetophenones, aminoacetophenones, anthraquinones, thioxanthones, ketals, benzophenones, xanthones and phosphine oxides. Specific examples of the photopolymerization initiators include triphenylsulfonium antimony hexafluoride, 2,2-dimethoxy-1,2-diphenylethan-1-one, 1-hydroxycyclohexyl phenyl ketone, 2-hydroxy-2-methyl-1-phenylpropan-1-one, 1-[4-(2-hydroxyethoxy)phenyl]-2-hydroxy-2-methyl-1-propane, 2-hydroxy-1-{4-[4-(2-hydroxy-2-methylpropionyl)benzyl]phenyl}-2-methylpropan-1-one, 2-benzyl-2-dimethylamino-1-(4-morpholinophenyl)-butanone-1,2-methyl-1-(4-methylthiophenyl)-2-morpholinopropan-1-one, bis(2,4,6-trimethylbenzoyl)phenylphosphine oxide, 2,4,6-trimethylbenzoyldiphenylphosphine oxide, bis(5-2,4-cyclopentadien-1-yl)-bis[2,6-difluoro-3-(1H-pyrrol-1-yl)phenyl]titanium and 2-hydroxy-1-{4-[4-(2-hydroxy-2-methylpropionyl)benzyl]phenyl}-2-methylpropan-1-one, which may be used either alone or in combination. Among these compounds, triphenylsulfonium antimony hexa fluoride, 2,2-dimethoxy-1,2-diphenylethan-1-one, 1-hydroxycyclohexyl phenyl ketone and 2-hydroxy-1-{4-[4-(2-hydroxy-2-methylpropionyl)benzyl]phenyl}-2-methylpropan-1-one are preferred for higher curing speed and thicker film curability.

The proportion of the photoacid generator (B) is preferably 0.1 to 10 parts by weight, more preferably 0.5 to 5 parts by weight, particularly preferably 1 to 3 parts by weight, based on 100 parts by weight of the resin component of the optical waveguide forming epoxy resin composition. If the proportion of the photoacid generator (B) is excessively small, it is difficult to provide satisfactory photo-curability by irradiation with ultraviolet radiation. If the proportion of the photoacid generator is excessively great, the photosensitivity is increased, resulting in abnormal pattern configuration and shorter pot life of the varnish.

As required, the optical waveguide forming epoxy resin composition may contain an additive in addition to the liquid epoxy resin (A) and the photoacid generator (B). Examples of the additive include a silane or titanium coupling agent for increasing the adhesiveness, an olefin oligomer, a cycloolefin oligomer or polymer such as a norbornene polymer, a synthetic rubber, a silicone compound and other flexibilizer, an antioxidant and a defoaming agent. These additives are each blended in a proportion that does not impair the effects. These additives may be used either alone or in combination.

As described above, the optical waveguide forming epoxy resin composition is free from the diluent component irrelevant to the curing reaction of the resin component. Where the optical waveguide forming epoxy resin composition is prepared in the form of a coating varnish as a cladding layer forming material without blending the diluent component (e.g., a conventionally used organic solvent), it is possible to avoid the solvent drying (pre-baking) step, thereby reducing the production costs.

The optical waveguide forming epoxy resin composition thus prepared preferably has a viscosity satisfying the following conditions (x) and (y):
(x) the viscosity is less than 100 Pas as measured at 25 C; and
(y) the viscosity is 0.5 to 8.0 Pa s as measured at 50 C with heating. Preferably, the viscosity ranges shown above are properly determined in consideration of the adaptability for the mask coating process and the dispenser drawing process and the handling ease of the coating varnish. The viscosity is measured at the respective temperatures (25 C and 50 C), for example, with the use of a standard rotor (1 34' R24) by means of a MODEL E80 viscometer (RE-80U) available from Toki Sangyo Co., Ltd.

Particularly preferred viscosity conditions are:
(x) the viscosity is less than 80 Pas as measured at 25 C (with a lower limit of 50 Pas); and
(y) the viscosity is 2 to 6 Pas as measured at 50 C with heating. If the viscosity measured at 25 C is excessively high in the condition (x), the optical waveguide forming epoxy resin composition has an extremely low fluidity to be thereby deteriorated in handling ease. If the viscosity measured at 50 C with heating is excessively low, the resulting varnish is liable to drip. If the viscosity measured at 50 C with heating is excessively high, the cladding layer formed by applying the resulting varnish is liable to have poorer thickness accuracy.

<<Optical Waveguide>>

An optical waveguide will be described, which is produced by using the optical waveguide forming epoxy resin composition as a cladding layer forming material.

The optical waveguide to be obtained includes, for example, a substrate, a cladding layer (under-cladding layer) formed in a predetermined pattern on the substrate, a core layer formed in a predetermined pattern on the cladding layer for transmission of an optical signal, and a cladding layer (over-cladding layer) formed over the core layer. In the optical waveguide to be obtained, the cladding layer is formed from the optical waveguide forming epoxy resin composition. Particularly, the optical waveguide forming epoxy resin composition is preferably used as both an under-cladding layer forming material and an over-cladding layer forming material. In the optical waveguide to be obtained, the cladding layer is required to have a lower refractive index than the core layer.

Here, the glass transition temperature Tg of the (cured) cladding layer formed by using the optical waveguide forming epoxy resin composition preferably has a lower limit of not lower than 55 C, more preferably not lower than 60 C, and preferably has an upper limit of not higher than 150 C, more preferably not higher than 130 C. If the Tg is excessively low, a core resin component is liable to infiltrate into the under-cladding layer, so that light transmitted through the core layer leaks into the under-cladding layer, resulting in an increased waveguide loss. If the Tg is excessively high, the elastic modulus is liable to increase, resulting in poorer flexibility.

The (cured) cladding layer formed by using the optical waveguide forming epoxy resin composition preferably has a refractive index of not higher than 1.56, particularly preferably not higher than 1.55. The refractive index of the (cured) cladding layer is measured, for example, in the following manner. A (cured) cladding layer having a thickness of about 10 m is formed on a smooth surface of a silicon wafer, and the refractive index of the cured cladding layer is measured at 850 nm by means of a prism coupler (SPA-4000) available from SAIRON TECHNOLOGY, Inc.

The optical waveguide is produced, for example, through the following steps. A substrate is prepared, and a photosensitive varnish of the optical waveguide forming epoxy resin composition is applied on the substrate. A photomask for exposure in a predetermined pattern (optical waveguide pattern) is provided on the resulting varnish coating film (under-cladding formation layer). Then, the under-cladding formation layer is irradiated with light such as ultraviolet radiation via the photomask and, as required, heat-treated to be thereby cured. Thereafter, a portion of the under-cladding formation layer unexposed to the light is dissolved away with the use of a developing liquid. Thus, an under-cladding layer (a lower portion of a cladding layer) is formed as having the predetermined pattern.

In turn, a core layer forming material (varnish) is applied on the under-cladding layer to form a (uncured) core formation layer. Then, a photomask for exposure in a predetermined pattern (optical waveguide pattern) is provided on the core formation layer. Subsequently, the core formation layer is irradiated with light such as ultraviolet radiation via the photomask and, as required, heat-treated. Thereafter, an unexposed portion of the core formation layer is dissolved away with the use of a developing liquid. Thus, a core layer is formed as having the predetermined pattern.

Subsequently, the over-cladding layer forming material is applied over the core layer. Then, the resulting over-cladding formation layer is irradiated with light such as ultraviolet radiation and, as required, heat-treated. Thus, an over-cladding layer (an upper portion of the cladding layer) is formed. Through these process steps, the intended optical waveguide is produced.

Exemplary materials for the substrate include a silicon wafer, a metal substrate, a polymer film and a glass substrate. Examples of the metal substrate include stainless steel plates such as of SUS. Specific examples of the polymer film include a polyethylene terephthalate (PET) film, a polyethylene naphthalate film and a polyimide film. The substrate typically has a thickness of 10 m to 3 mm.

The light irradiation is, for example, irradiation with ultraviolet radiation. Exemplary light sources for the irradiation with the ultraviolet radiation include a low pressure mercury lamp, a high pressure mercury lamp and an ultrahigh pressure mercury lamp. The dose of the ultraviolet radiation is typically about 10 to about 20000 $mJ/cm^2$, preferably about 100 to about 15000 $mJ/cm^2$, more preferably about 500 to about 10000 $mJ/cm^2$.

After the exposure by the irradiation with the ultraviolet radiation, a heat treatment may be performed for completion of a photoreaction for the curing. Conditions for the heat treatment are typically a temperature of 80 C to 250 C and a period of 10 seconds to 2 hours, preferably a temperature of 100 C to 150 C and a period of 5 minutes to 1 hour.

Where the optical waveguide forming epoxy resin composition is used as the cladding layer forming material, a resin composition containing a solid multi-functional aromatic epoxy resin and a solid (viscous) fluorene-containing bi-functional epoxy resin and optionally any of the various photoacid generators described above, for example, is used as the core layer forming material. Where the core layer forming material is prepared in the form of a varnish for coating, the resin composition is mixed with a proper amount of a conventionally known organic solvent so as to have a viscosity suitable for the coating.

Examples of the organic solvent include ethyl lactate, methyl ethyl ketone, cyclohexanone, 2-butanone, N,N-dimethylacetamide, diglyme, diethylene glycol methyl ethyl ether, propylene glycol methyl acetate, propylene glycol monomethyl ether, tetramethylfurane and dimethoxyethane. These organic solvents may be used either alone or in combination in a proper amount so as to impart the resin composition with a viscosity suitable for the coating.

Exemplary methods for application of each of the layer forming materials on the substrate include coating methods employing a spin coater, a coater, a round coater, a bar coater or the like, a screen printing method, a capillary injection method in which the material is injected into a gap formed with the use of spacers by the capillary phenomenon, and a continuous roll-to-roll coating method employing a coating machine such as a multi-coater. The optical waveguide may be provided in the form of a film optical waveguide by removing the substrate.

The optical waveguide thus produced can be used as an optical waveguide for a light transmission flexible printed board.

EXAMPLES

The present invention will be described by way of inventive examples thereof. However, it should be understood that the present invention be not limited to these inventive examples.

Inventive Example 1

Prior to production of an optical waveguide according to this example, photosensitive varnishes were prepare as a cladding layer forming material and a core layer forming material.
<Preparation of Cladding Layer Forming Material>

Under shaded conditions, 75 g of a liquid long-chain bi-functional semi-aliphatic epoxy resin (EXA-4816 available from DIC Corporation), 20 g of a liquid aliphatic bi-functional epoxy resin (CELLOXIDE 2021P available from Daicel Chemical Industries, Ltd.), 5 g of a liquid polycarbonate diol (PLACCEL CD205PL available from Daicel Chemical Industries, Ltd.) and 2.0 g of a photoacid generator (ADEKAOPTOMER SP-170 available from Adeka Corporation) were mixed together into a completely dissolved state at 50 C with heating and stirring by means of a hybrid mixer (MH500 available from KEYENCE Corporation). Then, the resulting mixture was cooled to a room temperature (25 C), and then filtered under higher temperature and higher pressure conditions with the use of a membrane filter having a pore diameter of 1.0 m. Thus, a photosensitive varnish was prepared as the cladding layer forming material.
<Preparation of Core Layer Forming Material>

Under shaded conditions, 50 g of a solid multi-functional aromatic epoxy resin (YDCN-700-10 available from Nippon Steel Chemical Co., Ltd.), 50 g of a solid (viscous) fluorene-containing bi-functional epoxy resin (OGSOL-EG-200 available from Osaka Gas Chemicals Co., Ltd.) and 2.0 g of a photoacid generator (ADEKAOPTOMER SP-170 available from Adeka Corporation) were mixed with 50 g of ethyl lactate, and completely dissolved in ethyl lactate at 85 C with heating and stirring. Then, the resulting mixture was cooled to a room temperature (25 C), and filtered under higher temperature and higher pressure conditions with the use of a membrane filter having a pore diameter of 1.0 m. Thus, a photosensitive varnish was prepared as the core layer forming material.
<Formation of Under-Cladding Layer>

The aforementioned photosensitive varnish as the cladding layer forming material was applied on a back surface of a flexible printed board substrate (FPC substrate) having an overall thickness of 22 m by means of a spin coater, whereby an uncured under-cladding formation layer was formed. It is noted that, if the substrate is removed in this state, an optical waveguide forming curable film is provided. The uncured under-cladding formation layer thus formed was exposed to light via a predetermined mask pattern (pattern width/pattern pitch (L/S)=50 m/200 m) by means of a UV irradiation machine (at 5000 $mJ/cm^2$ (with an I-line filter)), and then subjected to a post heat treatment (at 130 C for 10 minutes). Thereafter, the resulting under-cladding formation layer was developed in γ-butyrolactone (at 25 C for 3 minutes) and rinsed with water, and then dried on a hot plate (at 120 C for 10 minutes) for removal of water. Thus, an under-cladding layer (having a thickness of 15 m) was formed.

<Formation of Core Layer>

The photosensitive varnish as the core layer forming material was applied over the thus formed under-cladding layer by means of a spin coater, and then the organic solvent was dried on a hot plate (at 130 C for 5 minutes). Thus, a core formation layer was formed in an uncured film state. The uncured core formation layer thus formed was exposed to light via a predetermined mask pattern (pattern width/pattern pitch (L/S)= 50 m/200 m) by means of a UV irradiation machine (at 9000 mJ/cm$^2$ (with an I-line filter)), and then subjected to a post heat treatment (at 130 C for 10 minutes). Thereafter, the resulting core formation layer was developed in γ-butyrolactone (at 25 C for 4 minutes) and rinsed with water, and then dried on a hot plate (at 120 C for 10 minutes) for removal of water. Thus, a core layer (having a thickness of 50 m) was formed as having a predetermined pattern.

<Formation of Over-Cladding Layer>

The aforementioned photosensitive varnish as the cladding layer forming material was applied over the thus formed core layer by means of a spin coater, whereby an uncured over-cladding formation layer was formed. The uncured over-cladding formation layer thus formed was exposed to light by means of a UV irradiation machine (at 5000 mJ/cm$^2$ (with an I-line filter)), and then subjected to a post heat treatment (at 130 C for 10 minutes). Thereafter, the resulting over-cladding formation layer was developed in γ-butyrolactone (at 25 C for 3 minutes) and rinsed with water, and then dried on a hot plate (at 120 C for 10 minutes) for removal of water. Thus, an over-cladding layer (having a thickness of 10 m) was formed.

In this manner, an optical waveguide (having a thickness of 75 m) was produced, which was integrated with the FPC and included the under-cladding layer formed on the FPC substrate, the core layer formed in the predetermined pattern on the under-cladding layer, and the over-cladding layer formed over the core layer.

Inventive Example 2

An optical wave guide was produced in substantially the same manner as in Inventive Example 1, except that, in the preparation of the photosensitive varnish as the cladding layer forming material, the formulation of the resin component was changed to include 70 g of the liquid long-chain bi-functional semi-aliphatic epoxy resin (EXA-4816 available from DIC Corporation), 20 g of the liquid aliphatic bi-functional epoxy resin (CELLOXIDE 2021P available from Daicel Chemical Industries, Ltd.) and 10 g of the liquid polycarbonate diol (PLACCEL CD205PL available from Daicel Chemical Industries, Ltd.)

Inventive Example 3

An optical waveguide was produced in substantially the same manner as in Inventive Example 1, except that, in the preparation of the photosensitive varnish as the cladding layer forming material, the formulation of the resin component was changed to include 60 g of the liquid long-chain bi-functional semi-aliphatic epoxy resin (EXA-4816 available from DIC Corporation), 30 g of the liquid aliphatic bi-functional epoxy resin (CELLOXIDE 2021P available from Daicel Chemical Industries, Ltd.) and 10 g of the liquid polycarbonate diol (PLACCEL CD205PL available from Daicel Chemical Industries, Ltd.)

Inventive Example 4

An optical waveguide was produced in substantially the same manner as in Inventive Example 1, except that, in the preparation of the photosensitive varnish as the cladding layer forming material, the formulation of the resin component was changed to include 60 g of the liquid long-chain bi-functional semi-aliphatic epoxy resin (EXA-4816 available from DIC Corporation), 20 g of the liquid aliphatic bi-functional epoxy resin (CELLOXIDE 2021P available from Daicel Chemical Industries, Ltd.) and 20 g of the liquid polycarbonate diol (PLACCEL CD205PL available from Daicel Chemical Industries, Ltd.)

Inventive Example 5

An optical waveguide was produced in substantially the same manner as in Inventive Example 1, except that, in the preparation of the photosensitive varnish as the cladding layer forming material, the formulation of the resin component was changed to include 50 g of the liquid long-chain bi-functional semi-aliphatic epoxy resin (EXA-4816 available from DIC Corporation), 30 g of the liquid aliphatic bi-functional epoxy resin (CELLOXIDE 2021P available from Daicel Chemical Industries, Ltd.) and 20 g of the liquid polycarbonate diol (PLACCEL CD205PL available from Daicel Chemical Industries, Ltd.)

Inventive Example 6

An optical waveguide was produced in substantially the same manner as in Inventive Example 1, except that, in the preparation of the photosensitive varnish as the cladding layer forming material, the formulation of the resin component was changed to include 40 g of the liquid long-chain bi-functional semi-aliphatic epoxy resin (EXA-4816 available from DIC Corporation), 40 g of the liquid aliphatic bi-functional epoxy resin (CELLOXIDE 2021P available from Daicel Chemical Industries, Ltd.) and 20 g of the liquid polycarbonate diol (PLACCEL CD205PL available from Daicel Chemical Industries, Ltd.)

Comparative Example 1

An optical wave guide was produced in substantially the same manner as in Inventive Example 1, except that, in the preparation of the photosensitive varnish as the cladding layer forming material, the formulation of the resin component was changed to include 90 g of the liquid long-chain bi-functional semi-aliphatic epoxy resin (EXA-4816 available from DIC Corporation) and 10 g of the liquid aliphatic bi-functional epoxy resin (CELLOXIDE 2021P available from Daicel Chemical Industries, Ltd.) and not to include the liquid polycarbonate diol (PLACCEL CD205PL available from Daicel Chemical Industries, Ltd.)<

Comparative Example 2

An optical wave guide was produced in substantially the same manner as in Inventive Example 1, except that, in the preparation of the photosensitive varnish as the cladding layer forming material, the formulation of the resin component was changed to include 80 g of the liquid long-chain bi-functional semi-aliphatic epoxy resin (EXA-4816 available from DIC Corporation) and 20 g of the liquid aliphatic bi-functional epoxy resin (CELLOXIDE 2021P available from Daicel Chemical Industries, Ltd.) and not to include the liquid polycarbonate diol (PLACCEL CD205PL available from Daicel Chemical Industries, Ltd.)

Comparative Example 3

An optical waveguide was produced in substantially the same manner as in Inventive Example 1, except that, in the preparation of the photosensitive varnish as the cladding layer forming material, the formulation of the resin component was changed to include 35 g of the liquid long-chain bi-functional semi-aliphatic epoxy resin (EXA-4816 available from DIC Corporation), 45 g of the liquid aliphatic bi-functional epoxy resin (CELLOXIDE 2021P available from Daicel Chemical Industries, Ltd.) and 20 g of the liquid polycarbonate diol (PLACCEL CD205PL available from Daicel Chemical Industries, Ltd.)<

Comparative Example 4

An optical waveguide was produced in substantially the same manner as in Inventive Example 1, except that, in the preparation of the photosensitive varnish as the cladding layer forming material, the formulation of the resin component was changed to include 30 g of the liquid long-chain bi-functional semi-aliphatic epoxy resin (EXA-4816 available from DIC Corporation), 40 g of the liquid aliphatic bi-functional epoxy resin (CELLOXIDE 2021P available from Daicel Chemical Industries, Ltd.) and 30 g of the liquid polycarbonate diol (PLACCEL CD205PL available from Daicel Chemical Industries, Ltd.)

The photosensitive varnishes thus prepared and the optical waveguides thus produced were evaluated for the glass transition temperature Tg, the refractive index, the viscosity (at 25 C and 50 C), the linear loss, the bend loss and the flexibility by performing measurement in the following manner. The results are shown together with the formulations of the respective photosensitive materials below in Table 1.

<Measurement of Glass Transition Temperature Tg>

The photosensitive varnishes prepared as the cladding layer forming materials in Inventive Examples and Comparative Examples were each applied on a 1.1 mm thick glass substrate by means of an applicator, and dried (at 130 C for 10 minutes) to form an uncured film. The uncured film was exposed to light at 5000 mJ/cm$^2$ (with an I-line filter), and then subjected to a post heat treatment (at 130 C for 10 minutes) to provide a cured product. The cured product was separated from the glass substrate with the use of a cutter blade to provide a cured film. The cured film was used as a sample (having a thickness of 50 m) for the measurement of the glass transition temperature Tg. The glass transition temperature Tg of the sample was determined based on a tan value by means of a dynamic viscoelasticity analyzer (RSA3 available from TA Instruments Ltd.)

<Refractive Index>

The photosensitive varnishes prepared as the cladding layer forming materials in Inventive Examples and Comparative Examples were each applied on a 0.8 mm thick silicon wafer by means of a spin coater, and dried (at 130 C for 10 minutes) to form an uncured film. The uncured film was exposed to light at 5000 mJ/cm$^2$ (with an I-line filter), and then subjected to a post heat treatment (at 130 C for 10 minutes) to provide a cured film. The cured film was used as a sample (having a thickness of 10 m) for the evaluation of the refractive index. The refractive index of the sample was measured at 850 nm by means of a prism coupler (SPA-4000) available from SAIRON TECHNOLOGY, Inc.

<Viscosity>

The viscosity of each of the photosensitive varnishes prepared as the cladding layer forming materials in Inventive Examples and Comparative Examples was measured at 25 C and at 50 C with the use of a standard rotor (1 34' R24) by means of a MODEL E80 viscometer (RE-80U) available from Toki Sangyo Co., Ltd.

<Linear Loss>

The optical waveguides produced in Inventive Examples and Comparative Examples were each used as a sample. Light emitted from a light source (850-nm VCSEL light source OP250 available from Miki Inc.) was collected and inputted into the sample by means of a multi-mode fiber (FFP-G120-0500 available from Miki Inc.) having an MMF diameter of 50 m and an NA of 0.2. Then, light outputted from the sample was collected by a lens (FH14-11 available from Seiwa Optical Co., Ltd.) having a magnification of 20 and an NA of 0.4, and detected at 6 channels by a light measurement system (optical multi-power meter Q8221 available from Advantest Corporation) for evaluation. The sample was evaluated for the linear loss from an average total loss for the six channels based on the following criteria:

Acceptable (○): A sample having a total linear loss of not greater than 0.1 dB/cm Unacceptable (x): A sample having a total linear loss of greater than 0.1 dB/cm <Bend Loss>

The optical waveguides produced in Inventive Examples and Comparative Examples were each used as a sample. The sample was wound 360 degrees around a metal rod having a diameter of 2 mm, and light emitted from a light source (850-nm VCSEL light source OP250 available from Miki Inc.) was collected and inputted into the sample by means of a multi-mode fiber (FFP-G120-0500 available from Miki Inc.) having an MMF diameter of 50 μm and an NA of 0.2. Then, light outputted from the sample was collected by a lens (FH14-11 available from Seiwa Optical Co., Ltd) having a magnification of 20 and an NA of 0.4, and detected at 6 channels by a light measurement system (optical multi-power meter Q8221 available from Advantest Corporation) for evaluation. A difference between an average total loss for the six channels and the total linear loss determined in the aforementioned manner was calculated as the bend loss. Consequently, the sample was evaluated for the bend loss based on the following criteria:

Acceptable (○): A sample having a loss increased by not greater than 0.5 dB as compared with the initial value Unacceptable (x): A sample having a loss increased by greater than 0.5 dB as compared with the initial value <Flexibility>

The optical waveguides produced on the FPC substrates (as having an overall thickness of 75 m) in Inventive Examples and Comparative Examples were each used as a sample, which was cut into a 50 mm piece for use as a sample for evaluation of the flexibility. An IPC slide test was performed on the sample with a bending radius r of 1.5 mm, a sliding distance of 20 mm, a sliding speed of 20 mm/sec (in one way) and a stop period of zero. Consequently, the sample was evaluated based on the following criteria:

Acceptable (○): A sample not suffering from breakage even after being bent 100,000 or more times Unacceptable (x): A sample suffering from breakage when being bent less than 100,000 times

TABLE 1

| | Inventive Example | | | | | | Comparative Example | | | | (g) |
|---|---|---|---|---|---|---|---|---|---|---|---|
| | 1 | 2 | 3 | 4 | 5 | 6 | 1 | 2 | 3 | 4 | |
| Liquid epoxy resin (A) | | | | | | | | | | | |
| EXA-4816* (g) | 75 | 70 | 60 | 60 | 50 | 40 | 90 | 80 | 35 | 30 | |
| CELLOXIDE 2021P (g) | 20 | 20 | 30 | 20 | 30 | 40 | 10 | 20 | 45 | 40 | |
| Liquid resin | | | | | | | | | | | |
| PLACCEL CD205PL (g) | 5 | 10 | 10 | 20 | 20 | 20 | — | — | 20 | 30 | |
| Photoacid generator (B) | | | | | | | | | | | |
| ADEKAOPTOMER SP-170 (g) | 2 | 2 | 2 | 2 | 2 | 2 | 2 | 2 | 2 | 2 | |
| Evaluation | | | | | | | | | | | |
| Tg (C.) | 103 | 90 | 90 | 62 | 75 | 82 | 108 | 122 | 68 | 53 | |
| Refractive index | 1.55 | 1.54 | 1.54 | 1.54 | 1.53 | 1.53 | 1.55 | 1.55 | 1.53 | 1.52 | |
| Viscosity (Pa s) at 25 C. | 99.7 | 67.1 | 27.6 | 27.7 | 12.6 | 6.5 | >100 | >100 | 4.2 | 2.6 | |
| Viscosity (Pa s) at 50 C. | 5.2 | 4.0 | 2.1 | 2.2 | 1.2 | 0.8 | 15.8 | 7.6 | 0.5 | 0.2 | |
| Linear loss | ○ | ○ | ○ | ○ | ○ | ○ | ○ | ○ | ○ | | |
| Bend loss | ○ | ○ | ○ | ○ | ○ | ○ | | ○ | ○ | ○ | |
| Flexibility | ○ | ○ | ○ | ○ | ○ | ○ | ○ | ○ | | ○ | |

*Liquid epoxy resin represented by Formula (1)

The above results indicate that a higher glass transition temperature Tg (60 C or higher) and excellent flexibility were ensured in Inventive Examples in which the optical waveguides respectively included the cladding layers formed by using the photosensitive varnishes each containing the specific liquid epoxy resin in the specific proportion. In Inventive Examples, the increase in refractive index was suppressed, and the linear loss and the bend loss were acceptable. Thus, the optical waveguides of Inventive Examples were well-balanced in characteristic properties. Although the cladding layers were each formed without performing the solvent drying step in Inventive Examples, the resulting optical waveguides satisfied the fundamental optical waveguide property requirements (lower losses and higher flexibility).

In Comparative Examples 3 and 4 in which the proportion of the specific liquid epoxy resin in the resin component was less than 40 wt %, in contrast, the glass transition temperature Tg was lower, and the linear loss or the flexibility was unsatisfactory. In Comparative Example 1 in which the proportion of the specific liquid epoxy resin in the resin component was 90 wt % that was greater than 75 wt %, the viscosity was higher than 100 Pa s at a room temperature (25 C) and higher than 8.0 Pas at 50 C, so that a problem occurred in the coating step. Further, the bend loss was unacceptable. In Comparative Example 2 in which the proportion of the specific liquid epoxy resin in the resin component was 80 wt % that was greater than 75 wt %, the viscosity was higher than 100 Pas at a room temperature (25 C), so that a problem occurred in the coating step.

Although specific forms of embodiments of the instant invention have been described above in order to be more clearly understood, the above description is made by way of example and not as a limitation to the scope of the instant invention. It is contemplated that various modifications apparent to one of ordinary skill in the art could be made without departing from the scope of the invention.

The optical waveguide forming epoxy resin composition is useful as a material for forming a component of an optical waveguide, particularly as a cladding layer forming material. The optical waveguide produced by using the optical waveguide forming epoxy resin composition is used, for example, for a light transmission flexible printed board and the like.

What is claimed is:
1. An optical waveguide forming epoxy resin composition comprising:
(A) a liquid epoxy resin; and
(B) a photoacid generator;
    wherein the liquid epoxy resin (A) comprises a liquid epoxy resin represented by the following general formula (I) as a major component thereof in a proportion of 50 to 75 wt % based on the overall amount of a resin component:

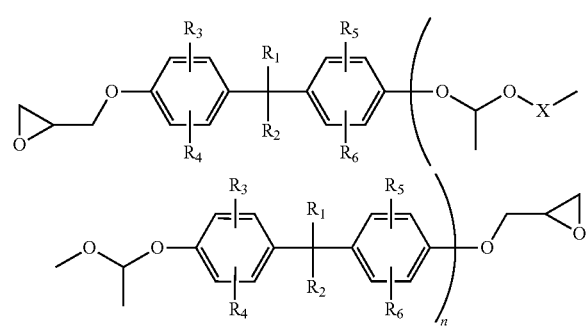

(1)

wherein $R_1$ and $R_2$ are each a hydrogen atom or a methyl group;
wherein $R_3$ to $R_6$ are each a hydrogen atom, a methyl group, a chlorine atom or a bromine atom;
wherein X is a $C_2$ to $C_{15}$ alkylene group, an ethyleneoxy group, a di(ethyleneoxy) group, a tri(ethyleneoxy) group, a propyleneoxy group, a propyleneoxypropyl group, a di(propyleneoxy)propyl group or a tri(propyleneoxy)propyl group;
wherein n is a natural number and has an average value of 1.2 to 5,
wherein the optical waveguide forming epoxy resin composition is free from a diluent component irrelevant to a curing reaction,
wherein the optical waveguide forming epoxy resin composition is free from a solid epoxy resin component, and wherein the optical waveguide forming epoxy resin composition has a viscosity satisfying the following conditions:
(x) the viscosity is 12.6 to 99.7 Pa·s as measured at 25° C.; and
(y) the viscosity is 1.2 to 5.2 Pa·s as measured at 50° C. with heating.

2. The optical waveguide forming epoxy resin composition according to claim 1, wherein the photoacid generator (B) is present in a proportion of 0.1 to 10 parts by weight based on 100 parts by weight of the resin component.

3. An optical waveguide forming curable film formed from the optical waveguide forming epoxy resin composition according to claim 1.

4. A light transmission flexible printed board which comprises an optical waveguide comprising:
a substrate;
a cladding layer provided on the substrate; and
a core layer provided in a predetermined pattern in the cladding layer for transmitting an optical signal;
wherein the cladding layer is formed by curing the optical waveguide forming epoxy resin composition according to claim 1.

5. A light transmission flexible printed board which comprises an optical waveguide comprising:
a substrate;
a cladding layer provided on the substrate; and
a core layer provided in a predetermined pattern in the cladding layer for transmitting an optical signal;
wherein the cladding layer is formed by curing the optical waveguide forming curable film according to claim 3.

6. A production method for a light transmission flexible printed board including an optical waveguide, the method comprising:
forming an under-cladding layer by curing an optical waveguide forming material;
forming a core layer in a predetermined pattern on the under-cladding layer; and
forming an over-cladding layer on the under-cladding layer to cover the core layer by curing an optical waveguide forming material;
wherein the optical waveguide material in the under-cladding layer forming step and the over-cladding layer forming step each comprise the optical waveguide forming epoxy resin composition according to claim 1,
wherein the optical waveguide producing process is free from a drying step of removing a diluent component.

7. The optical waveguide forming epoxy resin composition according to claim 1, wherein the optical waveguide forming epoxy resin composition has a viscosity satisfying the following conditions:
(x) the viscosity is 50 to 80 Pa·s as measured at 25° C.; and
(y) the viscosity is 2 to 5.2 Pa·s as measured at 50° C. with heating.

8. A production method for a light transmission flexible printed board including an optical waveguide, the method comprising:
forming an under-cladding layer by curing an optical waveguide forming material;
forming a core layer in a predetermined pattern on the under-cladding layer; and
forming an over-cladding layer on the under-cladding layer to cover the core layer by curing an optical waveguide forming material;
wherein the optical waveguide material in the under-cladding layer forming step and the over-cladding layer forming step each comprise the optical waveguide forming curable film according to claim 3,
wherein the optical waveguide producing process is free from a drying step of removing a diluent component.

* * * * *